United States Patent
Lotito et al.

[11] Patent Number: 6,079,738
[45] Date of Patent: Jun. 27, 2000

[54] OCCUPANT PRESENCE AND POSITION SENSING SYSTEM

[75] Inventors: James C. Lotito, Warren; Matthew W. Owen, Harper Woods; Christopher A. Eusebi, White Lake, all of Mich.

[73] Assignee: Breed Automotive Technology, Inc., Lakeland, Fla.

[21] Appl. No.: 09/045,405

[22] Filed: Mar. 20, 1998

Related U.S. Application Data

[63] Continuation-in-part of application No. 08/916,844, Aug. 22, 1997, abandoned.

[51] Int. Cl.[7] .................................................. B60R 21/32

[52] U.S. Cl. ............................................. 280/735; 280/734

[58] Field of Search ...................................... 280/734, 735

[56] References Cited

U.S. PATENT DOCUMENTS

| | | | |
|---|---|---|---|
| 5,330,226 | 7/1994 | Gentry et al. | 280/735 |
| 5,446,661 | 8/1995 | Gioutsos et al. | 280/735 |
| 5,531,472 | 7/1996 | Semchena et al. | 280/735 |

*Primary Examiner*—Eric Culbreth
*Attorney, Agent, or Firm*—Christopher Eusebi; Markell Seitzman

[57] ABSTRACT

An occupant sensing apparatus for controlling operating characteristics of a vehicle's safety restraint system is provided. The apparatus has a first proximity sensor emitting a field in a first direction and generating a first output signal indicative of the object and a second proximity sensor emitting a second field in a second direction that is substantially towards the field in the first direction and generating a second output signal indicative of the object. A controller receives the first and second output signals and generates a control signal that is used to control the operating characteristics of the vehicle's safety restraint system.

10 Claims, 11 Drawing Sheets

OCCUPANT PRESENCE AND POSITION SENSING SYSTEM

This application is a continuation-in-part of Ser. No. 08/916,844 filed Aug. 22, 1997, now abandoned.

BACKGROUND AND SUMMARY OF THE INVENTION

The present invention generally relates to vehicle safety restraint systems, and more particularly to an apparatus and method for accurately sensing the presence and position of an object within the vehicle such that the operating characteristics of the safety restraint system provide maximum passenger protection.

Vehicle safety restraint systems are a well-known means of attempting to reduce the likelihood of serious injury to passengers involved in a vehicle collision. These safety restraint systems include airbags that quickly inflate at the time of a collision in order to prevent the passenger from colliding with fixed objects in the vehicle's passenger compartment, particularly the steering column, dashboard and windshield of the vehicle.

In order to maximize passenger protection during a collision, it is desirable to vary the deployment characteristics of the airbag or operating characteristics of other safety restraint components based on passenger presence and position. Specifically, it is desirable to control factors such as the inflation profile and deployment timing of the airbag depending upon the position of the passenger in a seat (i.e. whether the passenger is "in position" or "out of position").

Vehicle crash conditions may also dictate non-deployment of the airbag. For instance, non-deployment of the airbag may be desirable if the severity of the crash is low and other safety restraint components can provide adequate protection of the passenger (e.g. the seat belt is in use and is sufficient protection in and of itself). In addition, the absence of a passenger in a vehicle seat, an out-of-position passenger, or a child in a child seat all present additional situations in which non-deployment of an airbag or modified deployment is desirable.

It has been shown that an occupant's position can be determined to a limited extent with the use of a single position sensor. The use of a single proximity sensor in order to determine occupant position and presence has several disadvantages. For example, while a single proximity sensor located in the instrument panel (IP) may indicate the distance of an object from the IP, the single sensor cannot distinguish whether a small object (i.e. a hand) is close to the IP or if the torso of the occupant is near the IP. The location of the occupant's torso, as opposed to identification of an "object's" position within a sensor field is advantageous in determining the actions of a vehicle restraint system during a collision.

In view of the foregoing, it is an object of the present invention to provide a system and methodology that accurately determines occupant presence and position for a vehicle safety restraint system that may be subsequently utilized to control the dynamic performance of various safety restraint components in the vehicle so that the actions of these safety restraint components may be controlled in accordance with the occupant's seating position and severity of an accident in order to maximize passenger protection in a vehicle collision. Additional advantages and features of the present invention will become apparent from the subsequent description and appended claims, taken in conjunction with the accompanying drawings.

In accordance with the teachings of the present invention, an occupant sensing apparatus for controlling operating characteristics of a vehicle's safety restraint system is provided. The apparatus has a first proximity sensor emitting a first field, forming a first zone, in a first direction and generating a first output signal indicative of the relative position of the occupant to the first sensor, and a second proximity sensor emitting a second field forming a second zone, in an opposite second direction that is substantially towards the first field and generating a second output signal indicative of the relative position of the occupant to the second sensor. A controller receives the first and second output signals and generates a control signal that is used to control the operating characteristics of the vehicle's safety restraint system.

BRIEF DESCRIPTION OF THE DRAWINGS

Other objects and advantages of the invention will become apparent upon reading the following detailed description and upon reference to the following drawings, in which.

The following description of the preferred embodiment is mainly exemplary in nature and is in no way intended to limit the invention or its application or uses.

DETAILED DESCRIPTION OF THE DRAWINGS

Figure 1:
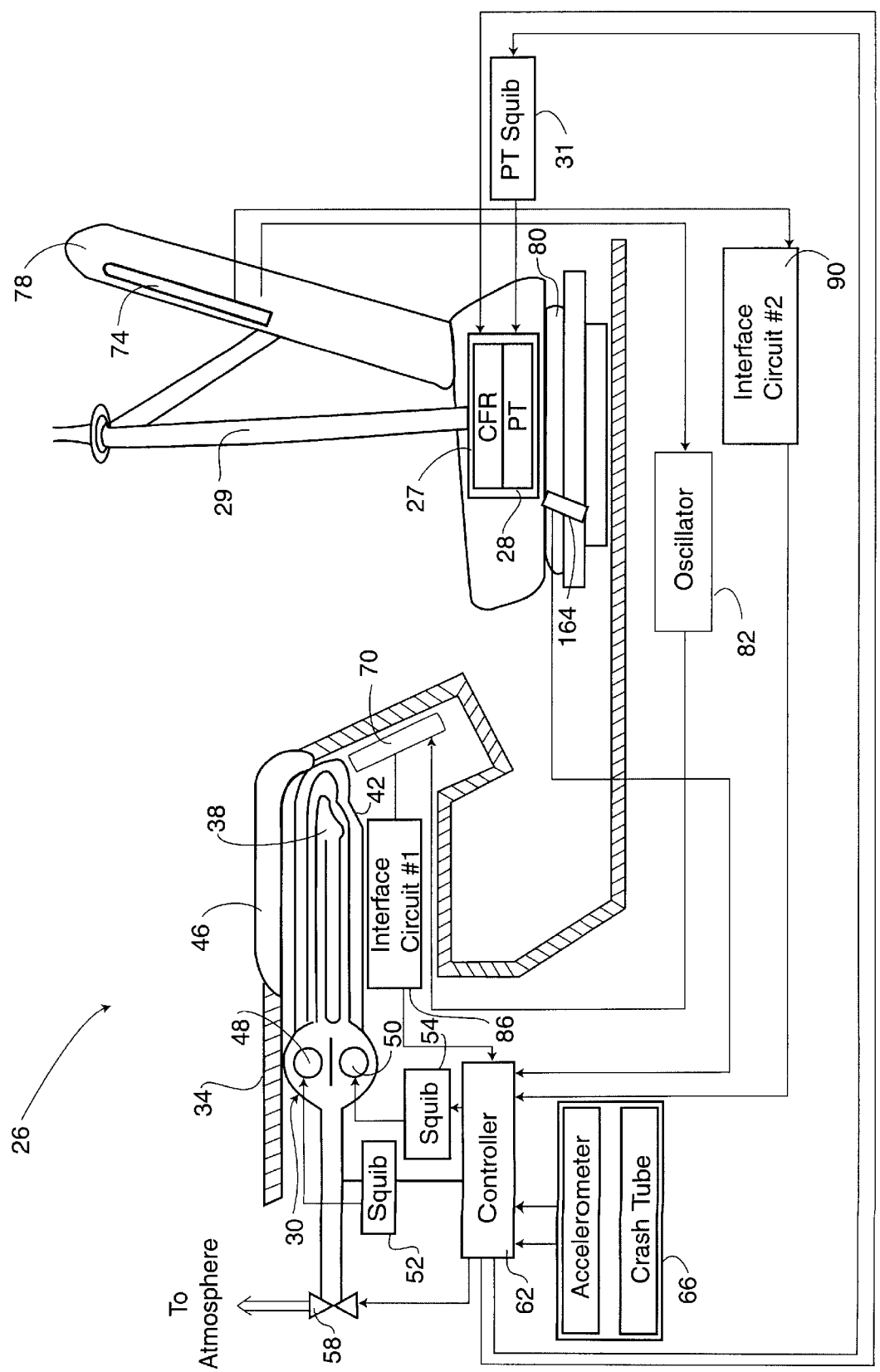
FIG. 1 is a vehicle restraint system including an occupant position sensing apparatus of a preferred embodiment of the present invention.

FIG. 1 shows a side view of a typical vehicle passenger compartment 26 having an occupant presence and position sensing apparatus in accordance with a preferred embodiment of the present invention that will be used to control the operating characteristics of the vehicle's safety restraint system. The vehicle safety restraint system includes a retractor 27 about which a seat belt 29 is wound, pretensioner or belt tightener 28 associated with either the retractor or buckle, and pretensioner squib 31 (which activates the pretensioner) for seat belt 29 control, and an airbag assembly 30 mounted in a dashboard or instrument panel 34 of the compartment 26.

The airbag assembly 30 has an airbag 38 that is folded and stored within the interior of an airbag housing 42. A deployment door 46 covers the airbag 38 and is configured to open upon inflation of the airbag 38. The door 46 can be part of the instrument panel or separate therefrom.

A first gas source 48 and second gas source 50 are mounted at the back of the housing 42 and operatively connected to the airbag 38. Gas from the first and/or second gas source 48,50 is provided to the airbag 38 such that the airbag 38 is filled to an inflated condition. Once inflated in response to an impact event, the airbag 38 cushions an occupant positioned in the passenger compartment 26.

The gas sources 48,50 typically have electrically actuated ignitors, referred to as squibs. A first squib 52 and second squib 54, when activated, actuate the first and/or second gas sources 48,50 to produce or release inflation gas. The squibs 52,54 may be singularly activated, simultaneously activated, or activated in staged sequence to control the rate or degree of airbag 38 deployment as desired.

An electrically controlled vent valve 58 is also connected to the airbag assembly 30 such that when the vent valve 58 is electrically opened, a certain amount of gas from the gas sources 48,50 is vented to the atmosphere, thereby decreasing the amount of gas entering the airbag 38 and providing additional airbag inflation control.

The squibs 52,54, vent valve 58, retractor 27 and/or buckle pretensioner 28 (via the pretensioner squib 31) are electrically activated by a controller 62, such as a microcomputer, when a crash event is sensed. The controller 62 provides the necessary signals such that the appropriate dynamic inflation profile of the airbag is produced and the seat belt action is tuned for particular crash conditions and the presence and/or position of the vehicle occupant.

Figure 2:
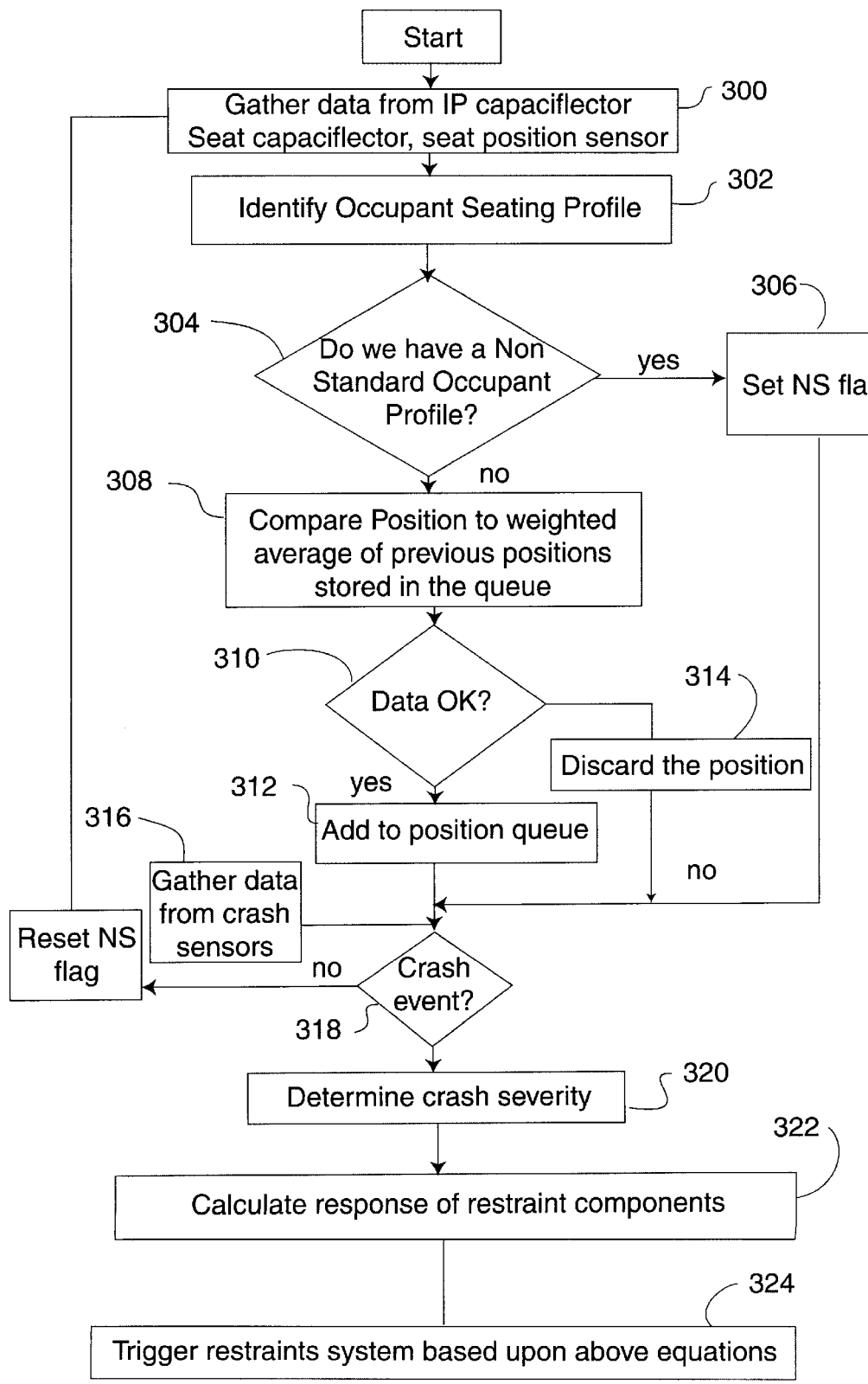
FIG. 2 is a flowchart illustrating the operation of the vehicle safety restraint system.

FIG. 2 presents an overview of the steps performed by the safety restraint system during an execution cycle of the controller. Initially, the controller gathers the voltages produced by an instrument panel (IP) capaciflector, seat capaciflector, and seat position sensor (block 300). Once these voltages are obtained, the seating profile of the occupant is identified using the gathered IP voltage, seat capaciflector voltage and the seat position sensor voltage (block 302), as will be subsequently described in further detail.

Once the seating profile is identified, a determination is made as to whether the proximity sensors, in conjunction with the position sensor, indicate a non-standard seating profile (block 304). Such a profile would be presented in situations where a seat occupant places a limb (i.e. feet or hand(s)) on the dashboard while remaining seated. In the event that a non-standard seating profile is indicated, a non-standard flag is set (block 306), however, if a determination is made that the sensors indicate that a standard occupant profile exists, a data verification step is performed by comparing the currently identified position to a weighted average of previous positions (block 308). This is conducted in order to ensure that the current position that has been determined is not anomalous (i.e. the measured occupant position is possible in view of the previous system readings).

If the data is determined to be within the range of possible positions (block 310), the identified position is added to a rotating storage queue that stores the most recent positions (block 312), otherwise the data is considered an anomaly and discarded (block 314). If the current position is considered to be unreliable, a weighted average may be used as the current position of the occupant or alternatively, a previous position that was considered to be reliable may be used.

Once the occupant position has been determined and this measurement has been verified, the system gathers information from crash sensors 66 that may include an accelerometer and/or a crash tube (see FIG. 1) (block 316). With the crash sensor information, a determination is made as to whether or not a crash has occurred (318). If a collision condition does exist, the severity of the impact is calculated from the crash sensor inputs (block 320). Once the severity has been determined, this factor is utilized along with the position data in order to calculate the response of each individual restraint component (block 322). Based upon these calculated restraint responses, the system triggers the restraint components to maximize passenger protection (block 324).

Maximum passenger protection is available from this safety restraint system due to an accurate determination of occupant presence and position. Referring again to FIG. 1, the controller receives presence and position information from the occupant presence and position sensing devices. The occupant presence and position sensing devices include a first proximity sensor 70 located in the front portion of the instrument panel 34, a second proximity sensor 74 mounted in the seat back 78, and a seat position sensor 76 mounted to the seat position track 80. The two proximity sensors 70,74 are synchronously driven by an oscillator circuit 82. It is preferable that the two sensors are driven at the same frequency. If the two sensors are not driven in this manner, aliasing effects are created, thereby providing unstable fields by which to identify occupant position. A first interface circuit 86 and second interface circuit 90 condition the output signals produced by the first and second proximity sensors 70,74.

Figure 3:
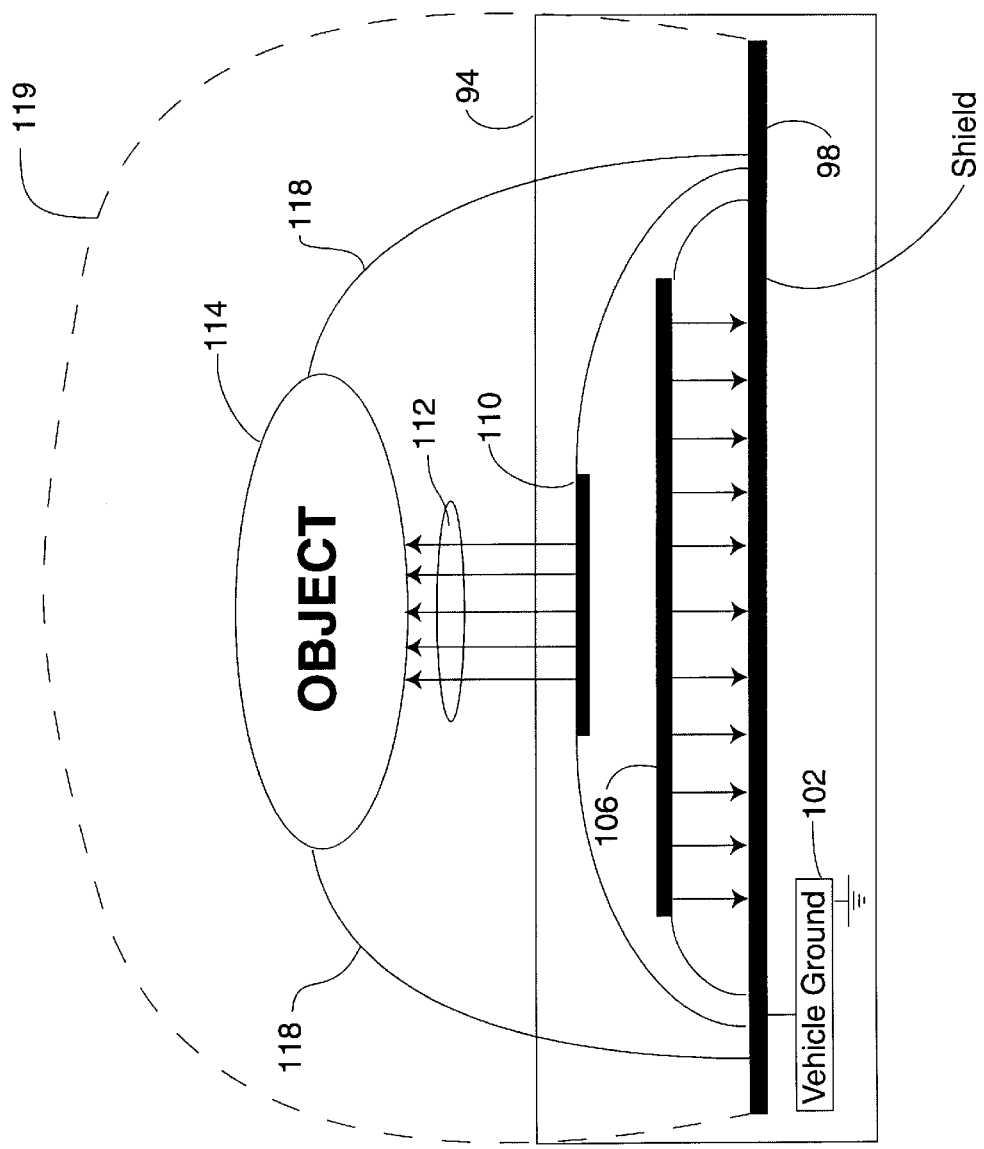
FIG. 3 is a capaciflector sensor utilized in a preferred embodiment of the present invention.

The proximity sensors used in the preferred embodiment of the present invention are capacitive proximity sensing elements, also known as capaciflectors. An illustrative capaciflector 94 is shown in FIG. 3. The capaciflector 94 has three conductive members with dielectric layers (not shown) interposed between the first 98 and second 106 conductive members and between the second 106 and third 110 conductive members. The first conductive member 98, also referred to as the ground plane, is connected to a vehicle ground 102. The second conductive member 106, also referred to as the shield electrode, is maintained at a voltage potential that is higher than vehicle ground 102. The second conductive member 106 is formed with a thin sheet of conductive material and located between the first conductive member 98 and a third conductive member 110.

The third conductive member 110, also known as the sensor electrode, is maintained in phase with the second conductive member 106 and at a voltage potential that is equal to or higher than the potential of the second conductive member 106. The third conductive member 110 reflects electric field lines 112 away from the grounded first conductive member 98 and toward a field intruding object 114. When the second and third conductive members 106,110 are energized, an extended electric field, generally indicated by reference number 118, is produced. This field 118 can extend several feet beyond the capaciflector 94 depending upon the voltages applied to the second and third conductive members 106,110. When an object 114 is introduced into the field 118, a negative electric charge is induced on the surface of the object 114. Therefore, the object 114 effectively becomes a capacitive electrode of the capaciflector 94 working in conjunction with the third conductive member 110.

The capaciflector 94 may be constructed of thin rigid or flexible conductive material having a suitable insulator, or can be constructed of a conductive polymer or metalized layer deposited on or incorporated into the fixtures of the vehicle. The size of the capaciflectors is dependent upon vehicle geometry, packaging restrictions, and the particular sensing resolution desired. Each capaciflector 94 may be a discreet component or integrated into other vehicle components (e.g., trim).

Figure 4:
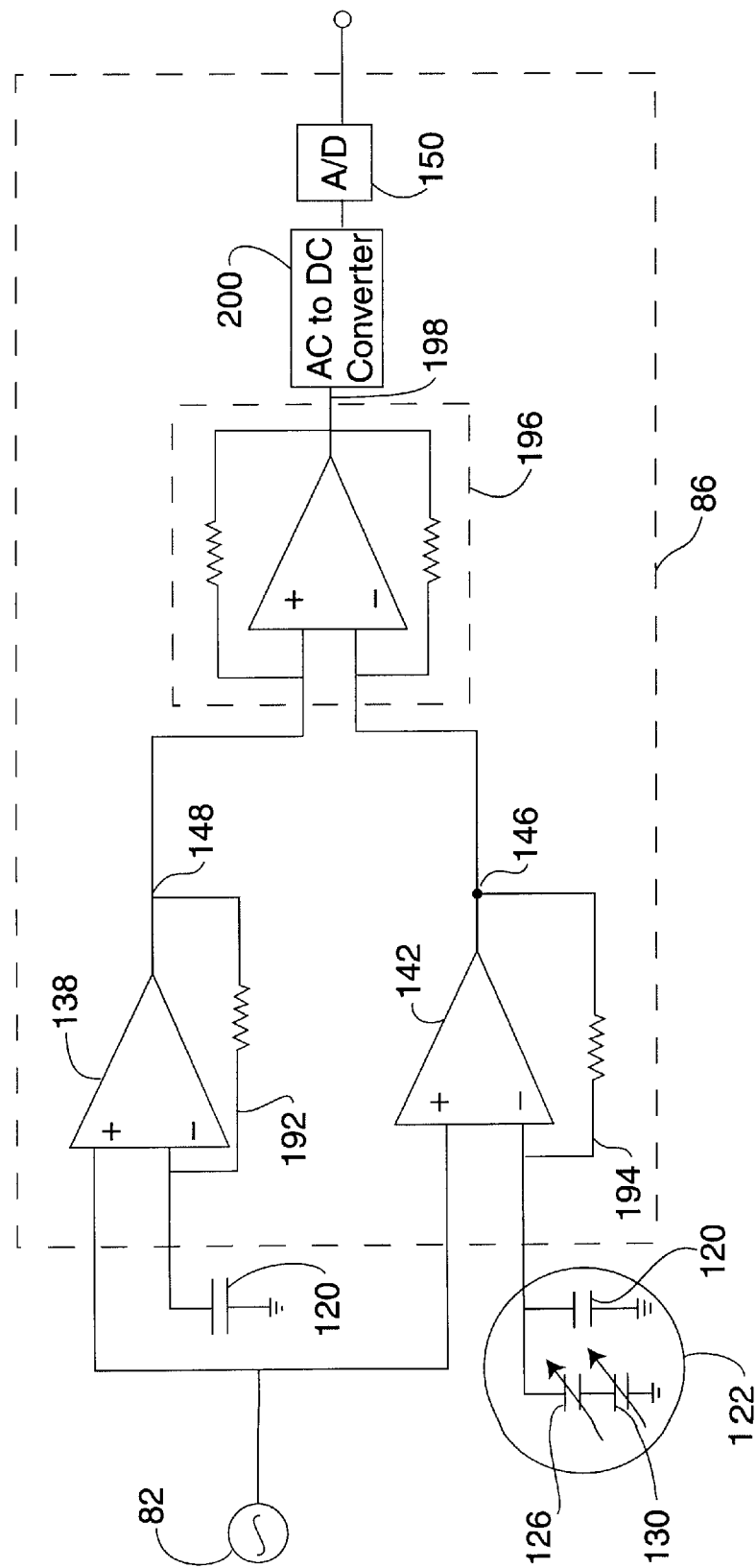
FIG. 4 is an interface circuit that is used to condition the output signal as received from a capaciflector sensor.

Referring to FIG. 4, the first interface circuit 86 is shown in further detail along with the equivalent capacitances 120,126,130 of the first proximity sensor. For purposes of brevity, only the first interface circuit 86 will be described in conjunction with the first proximity sensor (i.e. first capaciflector 70 as shown in FIG. 1). However, it will be understood that this description applies equally to the second proximity sensor (i.e. second capaciflector) 74 and second interface circuit 90.

The first interface circuit 86 has a first amplifier 138 and a second amplifier 142 that are arranged in the form of current followers. The oscillator 82 drives the first amplifier 138 and the second amplifier 142 at a substantially constant frequency of approximately 20 KHz. The feedback loop 192 of the first amplifier 138 and the feedback loop 194 of the second amplifier 142 include the effective capacitances of the first proximity sensor. Specifically, the first amplifier 138 is provided the equivalent capacitance of the second conductive member of the capaciflector to ground ($C_{sg1}$) 120, and the second amplifier 142 is provided an equivalent capacitance ($C_{eff1}$) 122 having three components.

The three components of the equivalent capacitance ($C_{eff1}$) 122 are the third member to ground capacitance ($C_{so1}$) 126, the object to ground capacitance ($C_{og1}$) 130, and the second member to ground capacitance ($C_{sg1}$) 120.

As previously indicated in the description of the capaciflector structure (see description in relation to FIG. 3), when an object is introduced into the field extending from the capaciflector, a negative charge is induced on the surface of the object, thereby effectively transforming the object into the third conductive member of the capaciflector. As the distance between the object and the capaciflector changes, the effective capacitance between the third member and the object ($C_{so1}$) 126, and the effective capacitance between the object and the vehicle ground changes. This in turn changes the effective capacitance ($C_{eff1}$) 122 provided to the second amplifier 142. This change in the effective capacitance ($C_{eff1}$) 122 alters the current in the feedback loop 194 of the second amplifier 142 and produces a second amplifier output 146.

The equivalent capacitance of the second conductive member to ground ($C_{sg1}$) 120, that is provided to the first amplifier 138 does not vary with the introduction of an object into the capaciflector field. Additionally, when an object is not present, the voltage potential at the first amplifier output 148 is substantially the same as the voltage potential at the second amplifier output 146, since the series combination of ($C_{so1}$) 126 and ($C_{og1}$) 130 does not exist. Therefore, when no object is present, the first amplifier output 148 and the second amplifier output 146 is summed by the summing circuit 196, with a result of approximately 0 volts appearing at the output 198. However, as the second amplifier output 146 changes when the object is introduced into the capaciflector field, a voltage differential will be produced by the summing circuit 196 which is representative of the distance of the object from the third conductive member of the capaciflector. This voltage differential appearing on output 198, is an AC signal which is then converted to a DC with a AC-to-DC converter 200. The resulting DC signal is sampled by an analog to digital converter (ADC) 150 and transformed for further processing by the controller 62.

Figure 5:
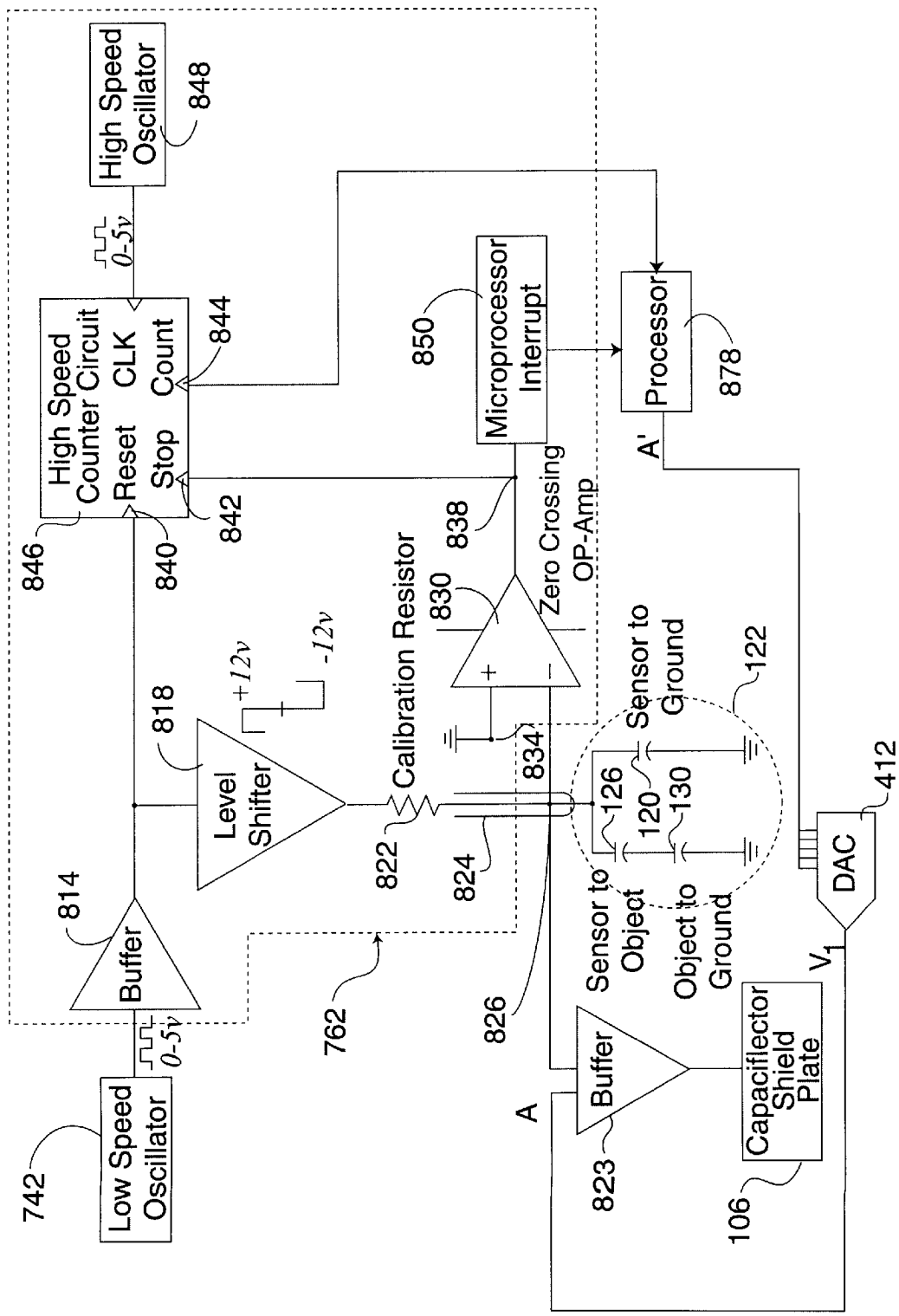
FIG. 5 is an alternative interface circuit that is used to condition the output signal as received from a capaciflector sensor.

Referring to FIG. 5, an alternative first interface circuit 762 (which can be substituted for the interface circuit of FIG. 4) is shown in further detail along with the equivalent capacitances 120, 126, 130 of the first proximity sensor. For purposes of brevity, only the first interface circuit 762 will be described in conjunction with the first proximity sensor 122. However, it should be understood that this description applies to the second interface circuit 90 and second proximity sensor 74, as shown in FIG. 1.

The first interface circuit 762 receives a 0–5 volt square wave driver signal from the low speed oscillator 742. Preferably, the low-speed oscillator 742 generates the square wave driver signal at a frequency of 1khz. A buffer 814 is provided for receiving the square wave driver signal prior to use by the additional components of the circuit 762. A level shifter 818, preferably implemented within an operational amplifier, receives the buffered 0–5 volt square wave driver signal and converts it to a plus/minus 12 volt square wave signal in which 0 volts corresponds to negative (−) 12 volts and 5 volts corresponds to positive (+) 12 volts. The plus/minus 12 volt square wave signal generated by the level shifter 818 is provided to the shield plate 106 of the capaciflector through a calibration resistor 822 and buffer 823.

As shown, the capaciflector 122 is depicted as multiple capacitors in parallel. Specifically, the equivalent capacitance of the third conductive member of the capaciflector to ground ($C_{sg1}$) 120 is in parallel with the equivalent capacitance of the third conductive member to object capacitance ($C_{so1}$) 126 and the object to ground capacitance ($C_{og1}$) 130. This configuration is provided by connecting the calibration resistor 822 to the capaciflector sensor 126 with a triaxial cable 824 attached to the ground plate 98, sensor plate 110 and shield plate 106 of the capaciflector 122.

As previously indicated, when an object is introduced into the field extending from the capaciflector, a negative charge is induced on the surface of the object, thereby effectively transforming the object into a fourth conductive plate. Because the capacitance of a capaciflector is proportional to the surface area of one of the conductive plates and inversely proportional to the distance between the two conductive plates which comprise the capacitor, the capacitance between the ground plate and the object ($C_{so1}$) 126 and the capacitance between the object and the ground ($C_{og1}$) will change as the distance between the object and the capaciflector varies. Accordingly, a time constant of an RC circuit formed by the calibration resistor 822 and the capaciflector capacitances 120, 126, 130 will vary based upon the interaction of an object with the capaciflector field. Specifically, the surface area of the object within the capaciflector field and/or distance between the object and the capaciflector.

In operation, the driver signal provided by the level shifter 818 is phase shifted at the positive input terminal 826 of a zero crossing operational amplifier 830 due to the changing time constant of the RC circuit. As the negative input terminal 834 of the zero crossing operational amplifier 830 is grounded, a zero crossing of the phase shifted driver signal will produce a 5 volt output at the output node 838 of the amplifier 830. This output is received by the microprocessor interrupt circuit 850 and stop input 842 of a high-speed counter circuit 846. The high-speed counter circuit 846 also receives a high frequency 5 volt square wave clock signal having a frequency of 66 Mhz from a high speed oscillator 848 and the 5 volt drive signal as produced from the buffer 814. The high-speed counter 846 is a free running counter which provides a count on a counter output 844. Furthermore, the counter 846 will continue to count until a reset signal is received at the reset input 840.

In order to determine the phase shift due to the presence of an object in the capaciflector field as indicated by the varying time constant, the counter 846 is configured such that the rising edge of the 5 volt signal provided by the buffer 814 resets the counter 846 and the counter begins counting at the high-speed clock rate of 66 million counts per second. When the zero crossing operational amplifier 838 produces the 5 volt output indicative of a rising edge of the phase shifted driver signal crossing zero volts, the high-speed counter 846 discontinues incrementing count. At the same instant in time, the microprocessor interrupt 850 is triggered by the 5 volt output which in turn signals the processor to read the counter output 844 of the high-speed counter circuit 846. With the number of counts captured, the amount of phase shift caused by the capaciflector may be determined and correlated to a distance from the object to the capaciflector and/or the surface area of the object within the capaciflector field.

Figure 8:
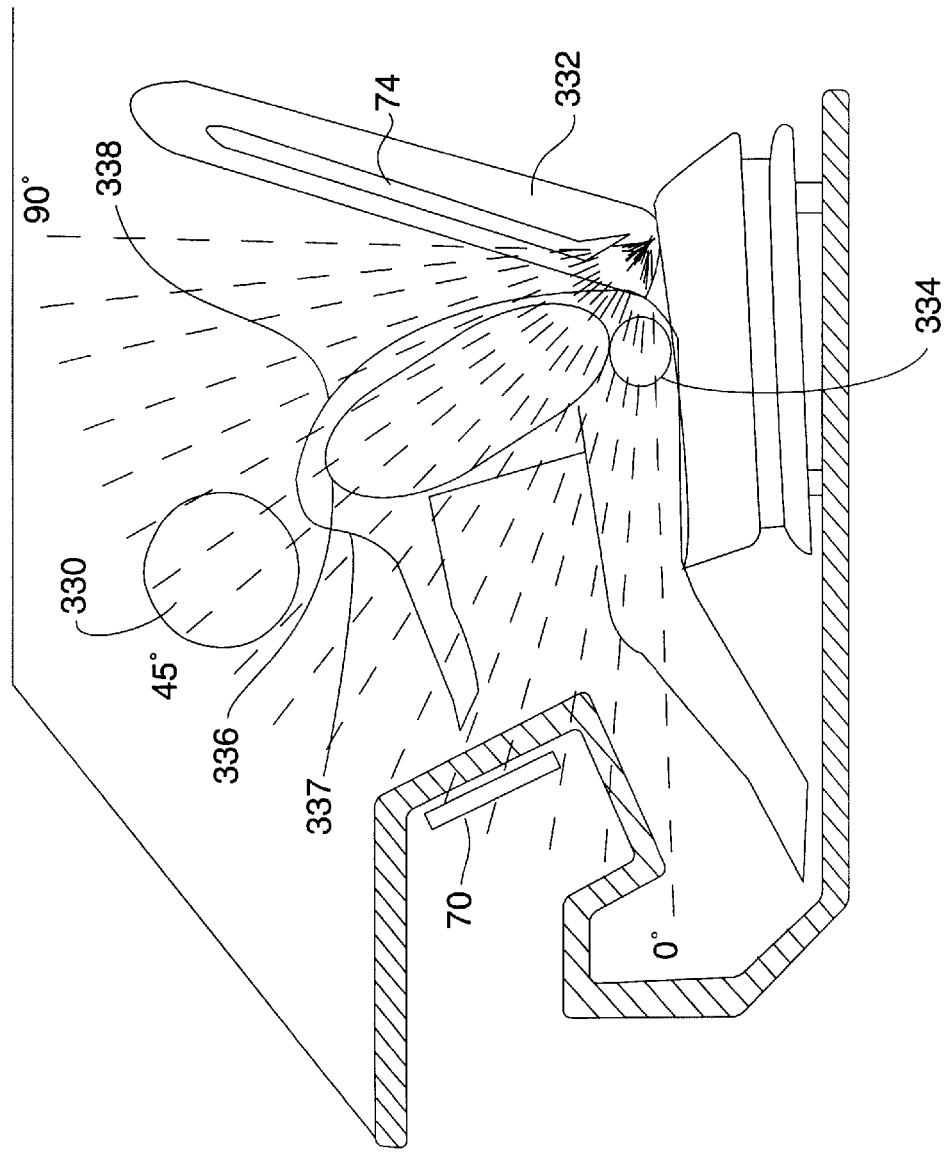
FIG. 8 is a vehicle passenger compartment with an occupant positioned within the passenger seat for experimental determination of sensor voltages that correspond to occupant torso angles.
Figure 10:
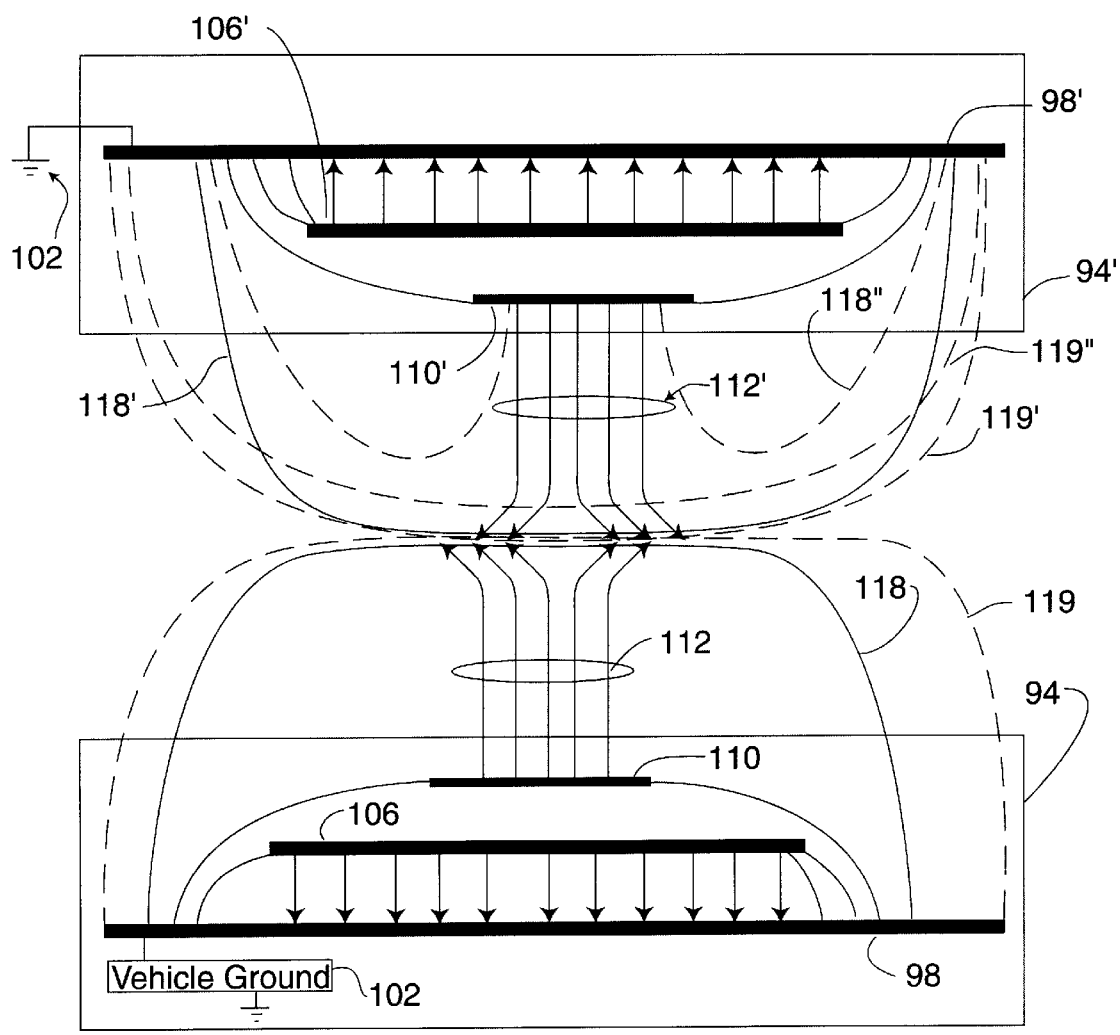
FIG. 10 is a pair of capaciflectors emanating shifting fields.
Figure 11:
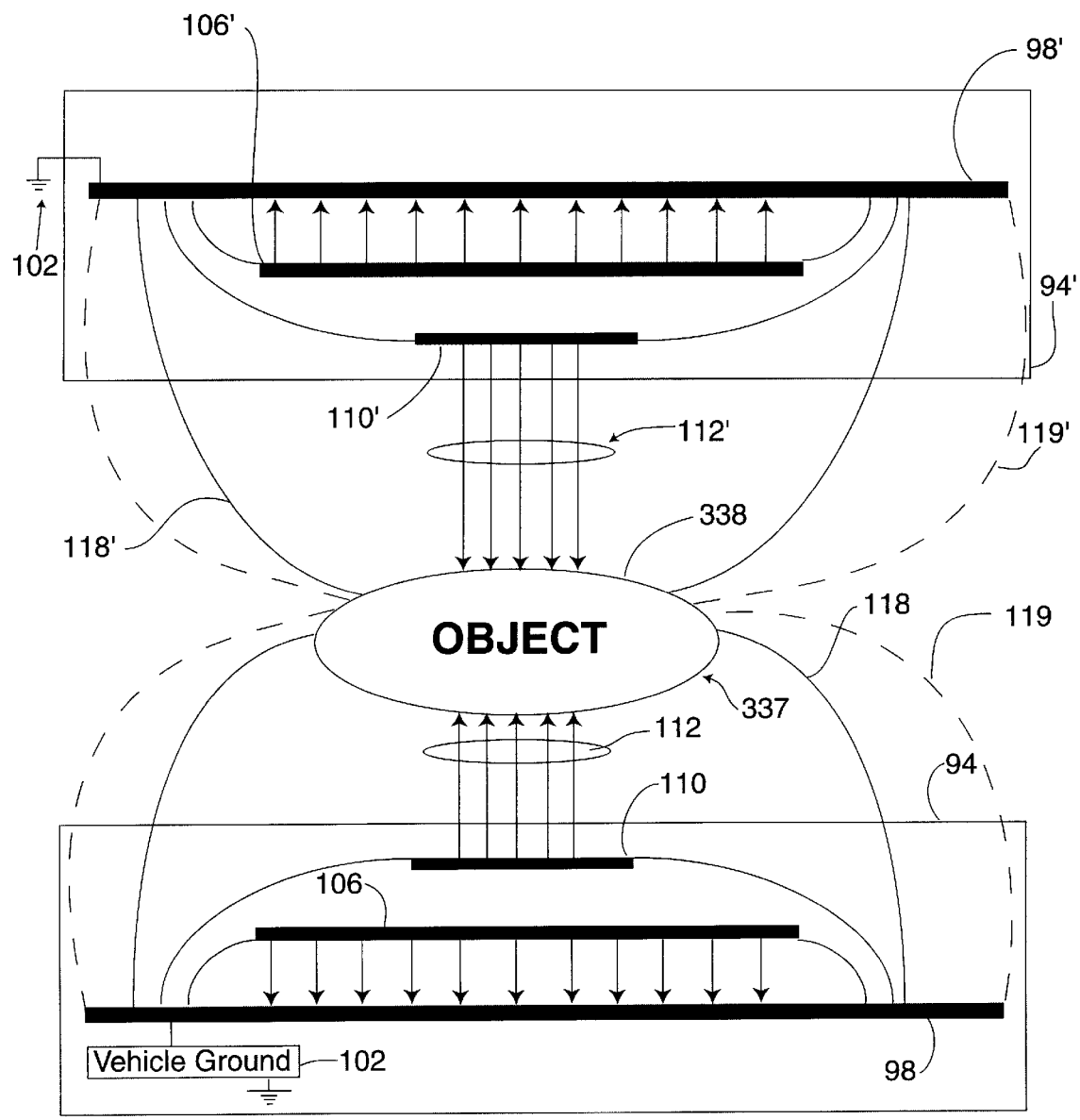
FIG. 11 is a pair of capaciflectors with an object in their fields.

Alternatively, FIG. 5 additionally shows the circuit between A and A' for changing the depth of the fields. A circuit is provided for varying the voltage applied to the shield plate 106 of the capaciflector. The processor 878 is connected to a multiplexing digital-to-analog converter 412 such as a Motorola DAC-08. A buffer 823 is provided between the DAC 412 and the driven shield plate 106. Initially, the processor 878 applies a voltage V1 to the shield plate 106 through a multiplexing digital-to-analog converter 412 and the buffer 823. The shield plate is being driven at the same frequency and in phase with the sensor plate 110. A determination is made by the processor 878 whether an occupant is detected in the field 118 (see FIG. 3) by evaluating whether a minimum value for a change in capacitance is detected. If an occupant 330 is not detected in the field 118, the processor 878 increases the voltage applied to the shield plate 106 extending the field 108 and thus the detection zone further into the occupant compartment. This process is repeated, as seen in FIG. 10, until either the maximum detectable field range is reached or an occupant is detected. If an occupant is detected in the field as seen in FIG. 11, the distance to the occupant is calculated. This distance represents the distance of the occupant 330, as seen in FIG. 1 to the sensor and the location of the occupant's forward edge 337 (see FIG. 8). A similar set of calculations is run from the capacitive sensor in the occupant vehicle seat 74. This gives the distance of the occupant's back 338 to the sensor and the location of occupant's back within the vehicle. It can be appreciated that by comparing the locations of the front and back locations of the occupant, a measure of the occupant's size can be determined. This data can not only give information on the size of the occupant, but can be used to determine the location of the occupant within the vehicle as seen in FIG. 8.

In addition to the controller 62 receiving dc signals from the first interface circuit 86 and second interface circuit 90, a dc signal is provided by the seat position sensor 164 (see FIG. 1).

Figure 6:
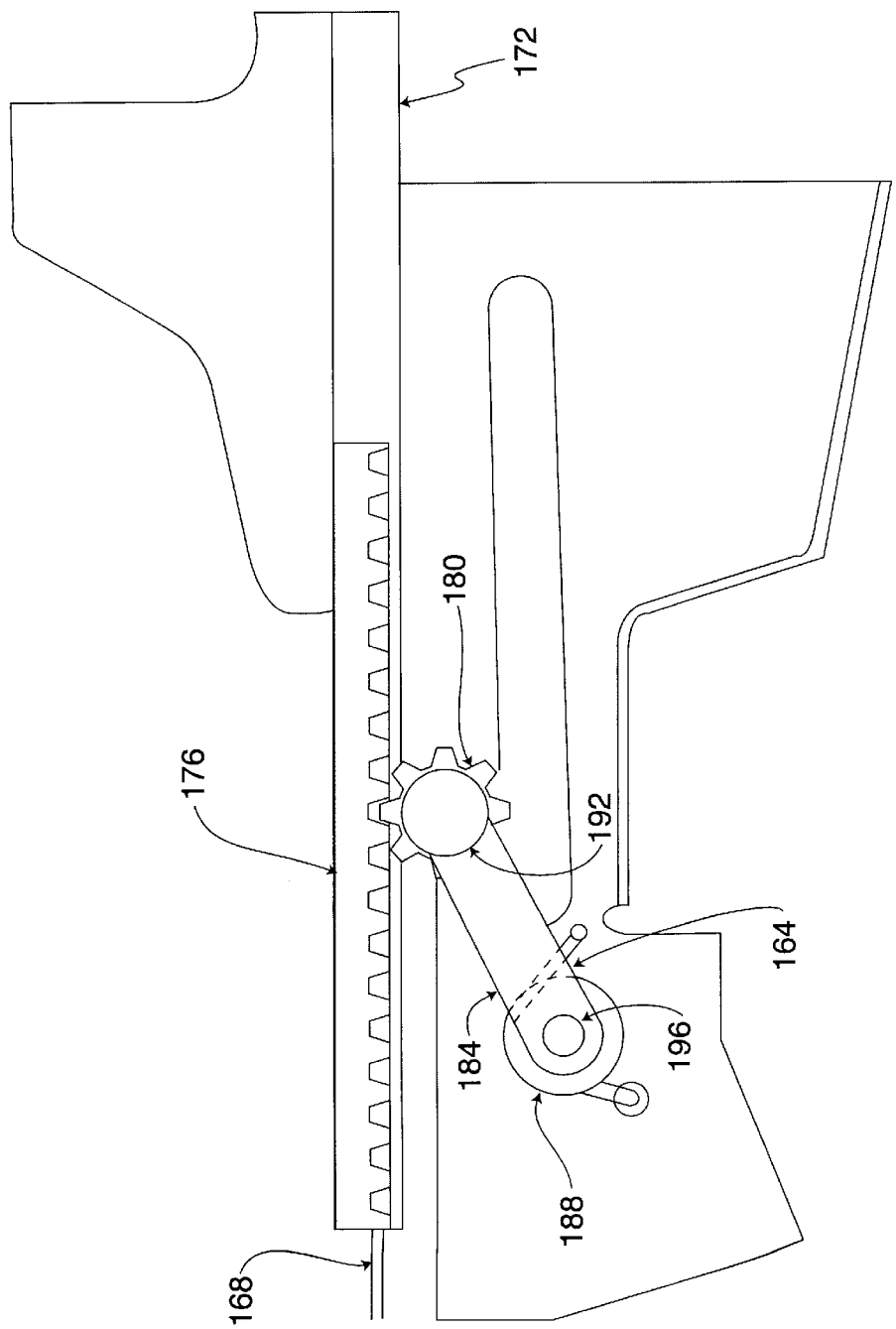
FIG. 6 is a seat position sensor utilized in a preferred embodiment of the present invention.

Referring to FIG. 6, the seat position sensor 164 is found in the seat track region of the seat assembly. Seat tracks are generally formed of a fixed lower track portion 168 and a translatable upper track portion 172. A rack 176 is provided which is integral to the upper track 172. The sensor mechanism is formed of a gear 180 on an idler arm 184 which is rotatably mounted to the non-movable portion of the seat, typically the lower track 168, and a biasing spring 188 used to engage the gear with the rack.

As further shown in FIG. 6, a multi-turn potentiometer 192 is coupled to the gear 180 and is used to measure the number of revolutions of the gear 180. Fore and aft position changes of the seat translate the rack 176 which causes the gear 180 to rotate. As the gear 180 rotates, the coupled multi-turn potentiometer 192 rotates causing a corresponding change in the resistance of the potentiometer 192, thereby altering the voltage generated by this sensor. This measured change in voltage correlates into a measurement of the lateral translation of the seat. An additional single turn potentiometer 196 can be coupled to the idler arm in the region of the pivot point. This potentiometer 196 may be used to measure the angular rotation of the idler arm. The measured change in rotation of the idler arm 184 in turn will correspond to the height of the seat in seats equipped with height adjustment.

Once the instrument panel (IP) capaciflector voltage, seat capaciflector voltage, and seat position sensor voltage are obtained, the controller 62 determines the position of the occupant in the seat relative to the air bag door 46.

Figure 7:
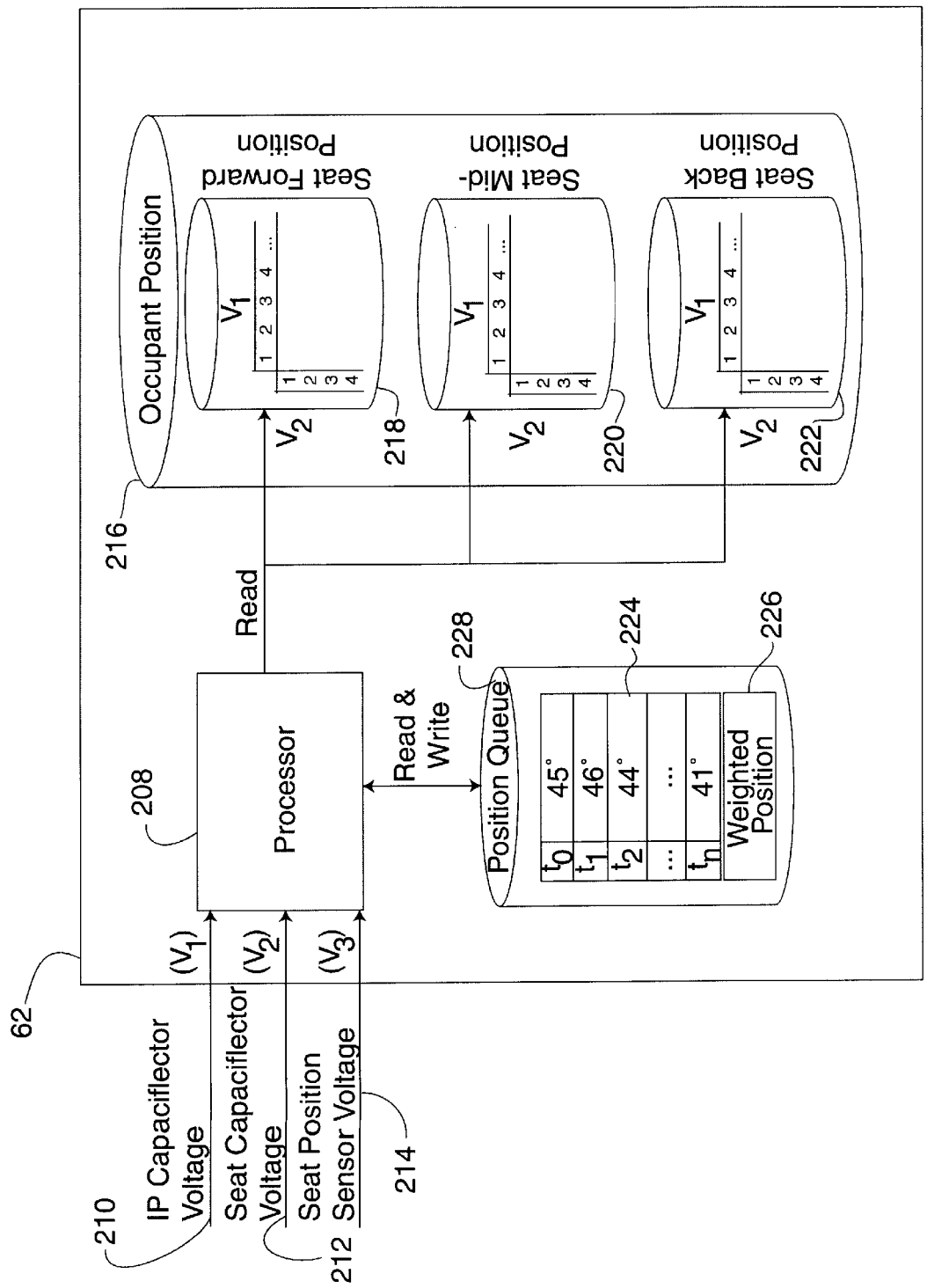
FIG. 7 is the controller of the vehicle restraint system in greater detail.

Referring to FIG. 7, the controller 62 is shown in further detail. As can be seen, a processor 208 or 878 of the controller 62 from FIG. 5, receives the IP capaciflector voltage 210, seat capaciflector voltage 212 and seat position sensor voltage 214. The processor 208 then accesses an occupant position memory storage device 216 that contains a seat forward-position data structure 218, seat mid-position data structure 220, and seat back-position data structure 222, with each data structure 218, 220, and 222 containing pre-generated data that provides an occupant torso angle for a corresponding IP capaciflector voltage 210 and seat capaciflector voltage 212.

In this description, the data contained in the data structures 218, 220, 222 is developed through experimental process. However, it should be readily understood that this data may be determined empirically, including generation through computer modeling. FIG. 8 illustrates an experimental setup for generating occupant position data. As can be seen, an occupant 330 is placed in the seat 332 and pivots about the hip 334 such that the torso 336 is moved through the possible torso angles (i.e. 90 degrees to 0 degrees). While the occupant is pivoting, the voltages from the IP capaciflector 70 and seat capaciflector 74 are measured and stored.

Figure 9:
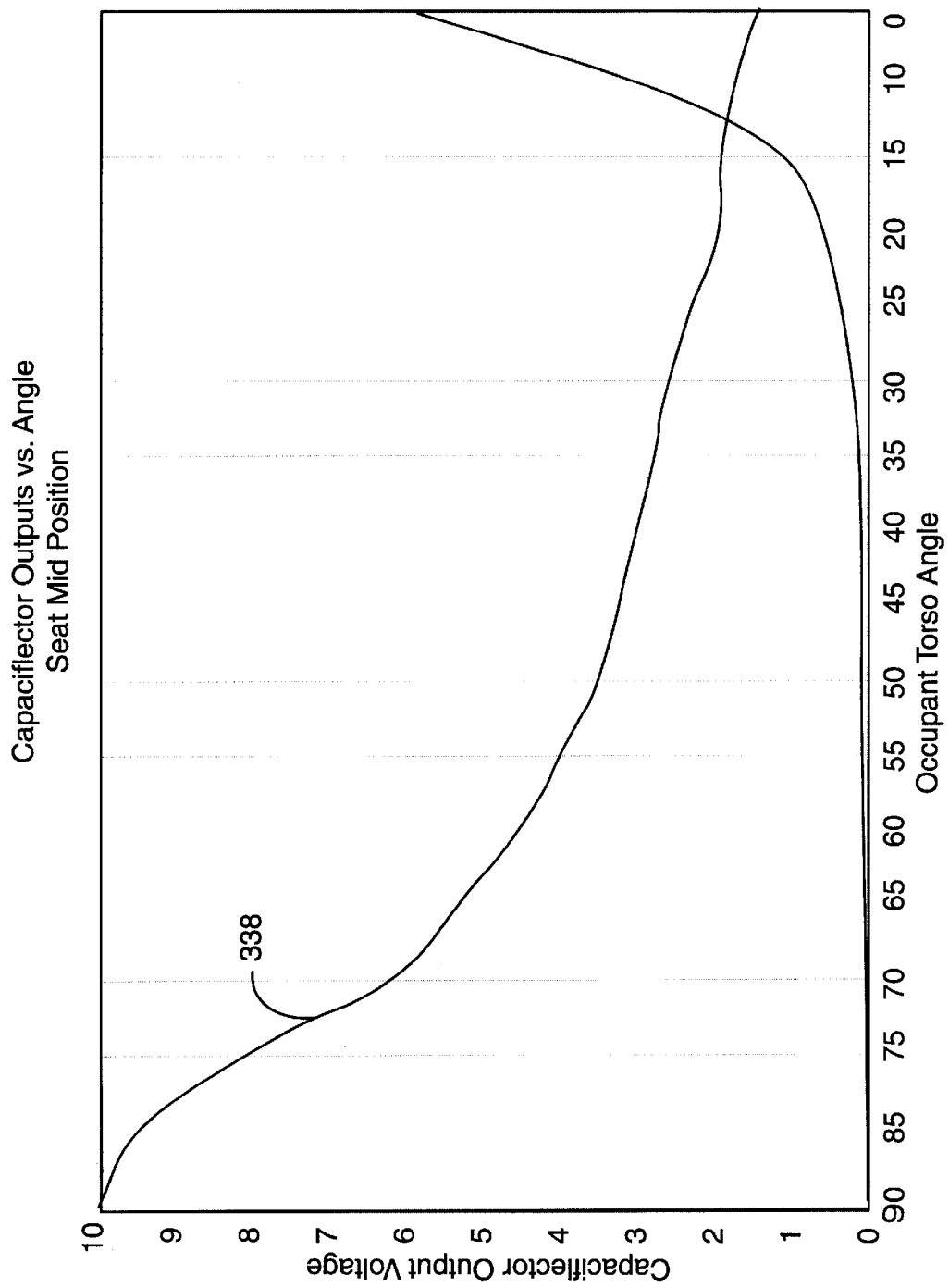
FIG. 9 is a graph illustrating the two proximity sensor voltages that correspond to the occupant torso angle for a mid-positioned seat.

FIG. 9 illustrates the measured voltages of these two capaciflectors for a particular occupant torso angle when the seat is in a mid-position. As would be expected, the voltage of the seat capaciflector 74 of FIG. 1 is at a high potential when the occupant torso angle is 90 degrees, thereby indicating that the occupant is in an upright position against the seat back. As the occupant bends forward, the voltage from the seat capaciflector decreases, and as the torso enters the field of the IP capaciflector 70, the voltage of the IP capaciflector 70 increases. Numerals 337 and 338 respectively indicate the occupant's forward edge and back. This experimental measurement process and storage is then repeated for different seat positions, with the generated data stored in the occupant position memory storage device 216 for subsequent access by the processor. As can be seen, these two capaciflector voltages may be used to accurately determine an occupant torso angle (e.g. a 2 volt output by the seat capaciflector and a 1 volt output by the IP capaciflector indicates an occupant torso angle of 15 degrees.)

Referring again to FIG. 7, the processor 62 or 878 accesses the appropriate data structure 218, 220, 222 based upon the seat position sensor voltage 214. Once the appropriate structure 218, 220, 222 has been accessed, the occupant torso angle is identified based upon a table lookup operation using the seat back and IP capaciflector voltages.

The selected torso angle (i.e. occupant position) as depicted in FIG. 8 is then verified against previously identified occupant positions 224 and a weighted position 226 stored in the position queue 228. Once these actions have been completed by the processor 208, additional tasks of the safety system are performed, including identification of a collision and determination of crash severity.

FIG. 10 depicts two general capaciflectors 94, 94' generating electric fields 118, 118' corresponding to capaciflectors 70 and 74 of FIG. 1. As can be seen, the two generated electric fields 118, 118' being negatively charged, repel each other and do not overlap. The capaciflectors 94, 94' having a fixed sensitivity, detect objects within a given detection volume 119, 119'. The size detection volume 119 for a single capaciflector 94 is a function of the plate size 106, 98, 110, as well as the sensor driving voltage. By simultaneously varying the non-overlapping detection volumes 119,119', it is possible to determine the distance of the forward most surface 337 of object 330 to the sensor 94. For example, by reducing the driving voltage of sensor 94', the electric field 118' and thus the size of the detection volume 119" is reduced. As depicted in FIG. 11, by determining if the object 330 is within a detection volume 119, 119' the location of the object 330 within the vehicle space 26 can be determined.

From the foregoing, it can be seen that a system and methodology for accurately determining occupant presence and position for a vehicle safety restraint system is provided. This system may be used to control the dynamic performance of various safety restraint components in the vehicle so that the actions of these safety restraint components may be tailored or matched to the occupant's seating position and severity of an accident, thereby maximizing passenger protection in a vehicle collision.

Those skilled in the art can now appreciate from this description that the broad teachings of the present invention can be implemented in a variety of forms. Therefore, the true scope of the invention is vast, and other modifications will become apparent to the skilled practitioner upon a study of the drawings, specification, and following claims.

What is claimed is:

1. An occupant sensing apparatus for controlling operating characteristics of a vehicle's safety restraint system, comprising:

a first proximity sensor (70) emitting a first field in a first direction and generating a first output signal indicative of an occupant being within a determinable detection volume of the first field (112);

a controller (62) receiving the first output signal and generating a control signal that is used to control the operating characteristics of the vehicle'safety restraint system;

a means (412) for changing the size of the first determinable detection volume (119);

a second proximity sensor (74) emitting a second field which detects the presence of an object within a second determinable detection volume (119') of the second field (112').

2. The apparatus as described in claim 1 wherein the first determinable detection volume (119) and the second determinable detection volume (119') do not overlap.

3. The apparatus as described in claim 2 further comprising:

a first means (412) for changing the size of the first and second determinable detection volumes (119).

4. The apparatus as described in claim 3 further wherein: the first means (412) includes a second means for decreasing the volume of the first determinable detection volume while increasing the size of the second determinable detection volume (119').

5. The apparatus as described in claim 3 wherein: the controller (62) determines the distance of an object from the first proximity sensor (70) by incrementally increasing the size of the detection volume (119) until an object is encountered.

6. The apparatus as described in claim 3 wherein the controller (62) determines the distance of an object from the second proximity sensor (74) by incrementally increasing the size of the detection volume (119') until an object is encountered.

7. The apparatus as described in claim 1 wherein the first proximity sensor comprises:

a circuit means (122) including a reference capacitor (120) and the sensor capacitor (126) for generating output signals (510, 520) indicative of the difference between the magnitude of the reference and sensor capacitors;

a fixed frequency oscillator (82) connected to the circuit means for driving the circuit means (122) at a fixed frequency;

an imbalance detector (830) responsive to the output of the circuit means (122) for generating conditioned signals;

counter means driven by the fixed frequency oscillator (82) and responsive to the output signals of the imbalance detector (830) for generating an output signal indicative of a phase difference between a reference arm of the circuit means (122) and an active arm of the circuit means (122), thereby providing an indication that an object is positioned in the electric field created by the sensor (70).

8. A method of determining the location of an occupant within a vehicle environment comprising the steps of:

A) providing a first proximity sensor which produces a first proximity field having a determinable detection volume;

B) providing a second proximity sensor which produces a second proximity field having a determinable detection volume;

C) providing a means for changing the size of the first and second determinable detection volumes;

D) providing a controller (62) for controlling a operating characteristics of a vehicle safety restraint system;

E) decreasing the size of the first determinable detection zone until no occupant is detected within the zone;

F) calculating a first minimum distance from the first proximity sensor to the occupant;

G) providing the first minimum distance information to the controller (62).

9. The method as described in claim 8, further comprising the steps of:

H) decreasing the size of the second determinable detection zone until no occupant is found within the second determinable zone;

I) calculating the minimum distance from the first proximity sensor to the occupant;

J) providing minimum distance information to the controller (62).

10. The method as described in claim 9, further comprising the steps of:

K) calculating a first optimum squib fire time;

L) providing an electrical current to a first squib (52);

M) providing an electrical current to a second squib (54).

* * * * *